(12) United States Patent
Inaba et al.

(10) Patent No.: US 7,558,137 B2
(45) Date of Patent: Jul. 7, 2009

(54) SEMICONDUCTOR MEMORY AND TESTING METHOD OF SAME

(75) Inventors: Souichi Inaba, Kawasaki (JP); Yoshiaki Okuyama, Kirishima (JP)

(73) Assignee: Fujitsu Microelectronics Limited, Tokyo (JP)

( * ) Notice: Subject to any disclaimer, the term of this patent is extended or adjusted under 35 U.S.C. 154(b) by 132 days.

(21) Appl. No.: 11/896,229

(22) Filed: Aug. 30, 2007

(65) Prior Publication Data

US 2008/0074938 A1    Mar. 27, 2008

(30) Foreign Application Priority Data

Sep. 27, 2006    (JP)    ............... 2006-262756

(51) Int. Cl.
*G11C 7/00* (2006.01)
(52) U.S. Cl. ...................................... 365/201; 365/207
(58) Field of Classification Search ................ 365/201, 365/207, 205
See application file for complete search history.

(56) References Cited

U.S. PATENT DOCUMENTS 5,479,374 A * 12/1995 Kobayashi et al. ....... 365/233.5
5,625,597 A * 4/1997 Hirose ........................ 365/201
7,088,634 B2 * 8/2006 Lee ............................. 365/222

FOREIGN PATENT DOCUMENTS

JP    11-317098 A    11/1999
JP    2001-195900 A    7/2001

* cited by examiner

*Primary Examiner*—Anh Phung
(74) *Attorney, Agent, or Firm*—Arent Fox LLP

(57) ABSTRACT

Column switches are disposed for sense amplifiers respectively and are selectively turned on according to a column address to connect the sense amplifiers to a common data line. A sense amplifier control circuit activates a sense amplifier activation signal to operate the sense amplifiers. During a test mode, the sense amplifier control circuit changes time interval from activation of a word line to the activation of the sense amplifier activation signal, according to the column address. Then, a time interval after data is read to a bit line from a test target memory cell until the corresponding sense amplifier starts an amplifying operation is made constant irrespective of the position of the memory cell. Consequently, the same test condition can be set for the memory cells irrespective of the memory cells' positions. Correct evaluation of operation margins of the memory cells is possible irrespective of the positions of memory cells.

6 Claims, 12 Drawing Sheets

SEMICONDUCTOR MEMORY AND TESTING METHOD OF SAME

CROSS REFERENCE TO RELATED APPLICATION

This application is based upon and claims the benefit of priority from Japanese Patent Application No. 2006-262756, filed on Sep. 27, 2006, the entire contents of which are incorporated herein by reference.

BACKGROUND

1. Field

The present invention relates to a semiconductor memory having sense amplifiers amplifying a signal amount of data read from memory cells.

2. Description of the Related Art

Generally, in a semiconductor memory, to read data, a signal amount of the data outputted from a memory cell to a bit line is amplified by a sense amplifier. For example, a memory cell of a DRAM stores logic of data as an electric charge in a cell capacitor. The electric charge stored in the memory cell gradually decreases and in due time the data held in the memory cell is lost. Therefore, the DRAM requires periodic refresh operations in order to retain data in the memory cell.

A characteristic of retaining the electric charge of a memory cell varies depending on the position of the memory cell, manufacturing conditions, and so on. A memory cell with a poor characteristic, that, is a memory cell with a small operation margin needs to be replaced by a redundancy memory cell. A method of capable of evaluating the operation margin of a memory cell is, for example, to shorten a time interval after data is outputted from the memory cell to a bit line in response to the activation of a word line until a sense amplifier starts an amplifying operation. If the timing for the sense amplifier to start the amplifying operation is made earlier, a read failure more easily occurs in a memory cell with a smaller operation margin.

There has been proposed another method to detect a memory cell with a small operation margin, by shortening a time interval after the amplifying operation of the sense amplifier is started until a column switch is turned on (for example, Japanese Unexamined Patent Application Publication No. Hei 11-317098). There has also been proposed a method to detect a memory cell with a small operation margin, in particular, a memory cell having a minute leakage path, by increasing a time interval after a word line is activated until a sense amplifier starts an amplifying operation (for example, Japanese Unexamined Patent Application Publication No. 2001-195900).

However, in the conventional methods of evaluating an operation margin of a memory cell, signal delay depending on the position of the memory cell is not taken into consideration. For example, in a memory cell, ON timing of a transfer transistor connected to a word line is more delayed as it is more apart from a word driver. Therefore, in a case where, for example, the same amplification start timing is set for sense amplifiers corresponding to all the memory cells, the operation margins of the memory cells cannot be correctly evaluated. As a result, there is a risk of shipping semiconductor memories to be excluded as bad chips to the market.

SUMMARY

It is an object of the present invention to correctly evaluate operation margins of memory cells irrespective of the positions of the memory cells.

According to an aspect of the present invention, column switches are disposed for sense amplifiers respectively and are selectively turned on according to a column address to connect the sense amplifiers to a common data line. A sense amplifier control circuit activates a sense amplifier activation signal to cause the sense amplifiers to operate. During a test mode, the sense amplifier control circuit changes a time interval from activation of the word line up to the activation of the sense amplifier activation signal, according to the column address. Consequently, a time interval after data is read from the test target memory cell to the bit line until the corresponding sense amplifier starts an amplifying operation is made constant irrespective of a position of the memory cell. As a result, the same test condition can be set for the memory cells irrespective of the positions of the memory cells. That is, it is possible to correctly evaluate the operation margins of the memory cells irrespective of the positions of the memory cells.

For example, during the test mode, the word line is activated and data is written to the test target memory cell via the bit line. The word line is activated again and the data is read from the test target memory cell to the bit line. Next, the sense amplifier control circuit activates the sense amplifier activation signal at timing according to the column address, and amplifies a signal amount of the data on the bit line. Then, when a logic value of the data whose signal amount is amplified is different from an expected value, a failure of the semiconductor memory is detected.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DETAILED DESCRIPTION OF THE EMBODIMENTS

Figure 1:
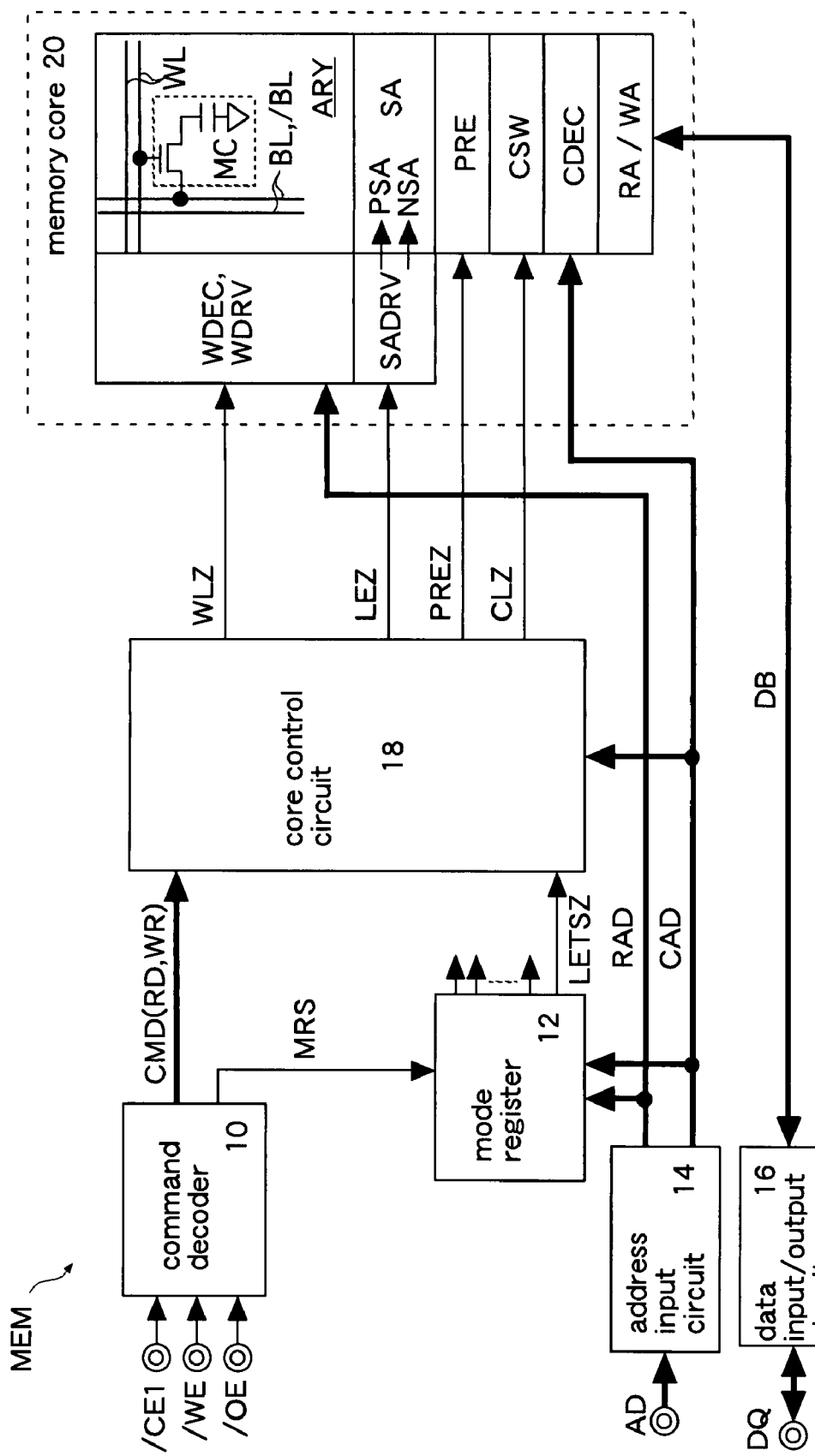
FIG. 1 is a block diagram showing a first embodiment of the present invention.

Hereinafter, embodiments of the present invention will be described, using the drawings. In the drawings, each signal line shown by the heavy line is constituted of a plurality of lines. Further, part of blocks to which the heavy lines are connected is constituted of a plurality of circuits. Each signal line through which the signal is transmitted is denoted by the same reference symbol as the signal name. Each signal starting with "/" represents negative logic. Each signal ending with "Z" represents positive logic. Each double circle in the drawings represents an external terminal.

FIG. 1 shows a first embodiment of the present invention. A semiconductor memory MEM is, for example, a FCRAM (Fast Cycle RAM). The FCRAM is a pseudo SRAM having memory cells of a DRAM and having an interface of a SRAM. The memory MEM has a command decoder 10, a mode register 12, an address input circuit 14, a data input/output circuit 16, a core control circuit 18, and a memory core 20. Further, the semiconductor memory MEM has a refresh timer, a refresh address counter, and so on, which are not shown, for automatic execution of a refresh operation. The present invention does not relate to the control of the refresh operation of the memory cells, and therefore, circuits and operations involved in the refresh operation are not described.

The command decoder 10 outputs a command CMD, which is recognized according to logic levels of a chip enable signal /CE1, a write enable signal /WE, and an output enable signal /OE, as a read command RD, a write command WR, a mode register set command MRS, and the like in order to have an access operation of the memory core 20 executed. The read command RD and the write command WR are access commands (access requests) to cause an access operation of the memory core 20 to be executed. The mode register set command MRS is a command to set the mode register 12.

The mode register 12 is set, for example, according to an address signal AD (RAD, CAD) supplied together with the mode register set command MRS. The mode register 12 outputs a test signal LETSZ or the like according to a set value in order to change operating specifications of the memory MEM. The value of the mode register 12 is rewritable from an external part of the memory MEM and the mode register 12 functions as a mode setting unit for switching an operation mode between a normal operation mode and a test mode according to the held value.

The address input circuit 14 receives an address AD and outputs the received address as a row address RAD and a column address CAD. According to the row address RAD, a later-described word line WL is selected. According to the column address CAD, bit lines BL, /BL are selected.

The data input/output circuit 16 receives write data via a data terminal DQ and outputs the received data to a data bus DB. Further, the data input/output circuit 16 receives, via the data bus, read data from memory cells MC, and outputs the received data to the data terminal DQ.

The core control circuit 18 outputs a word line activation signal WLZ, a sense amplifier activation signal LEZ, a precharge control signal PREZ, and a column selection signal CLZ in response to the read command RD and the write command WR, in order to have the memory core 20 execute a read operation and a write operation. The word line activation signal WLZ is a timing signal controlling activation timing of the word line WL. The sense amplifier activation signal LEZ is a timing signal controlling activation timing of sense amplifiers SA. The column selection signal CLZ is a timing signal controlling ON timing of column switches CSW. The precharge control signal PREZ is a timing signal controlling ON/OFF of precharge circuits PRE.

During the test mode, the core control circuit 18 changes activation timing of the sense amplifier activation signal LEZ according to the column address CAD. The test mode is recognized based on the activation of the test signal LETSZ outputted from the mode register 12. That is, the memory MEM operates in the normal operation mode while the test signal LETSZ is inactive, and operates in the test mode while the test signal LETSZ is active. The core control circuit 18 functions as a sense amplifier control circuit which recognizes whether a set mode is the normal operation mode or the test mode by detecting logic level of the test signal LETSZ that changes according to the value held in the mode register 12 and sets the activation timing of the sense amplifier activation signal LEZ differently in the normal operation mode and in the test mode. The activation timing of the sense amplifier activation signal LEZ will be described in FIG. 6, FIG. 7, and FIG. 8.

The memory core 20 has a memory cell array ARY, a word decoder WDEC, a word driver WDRV, sense amplifier drivers SADRV, the sense amplifiers SA, the precharge circuits PRE, the column switches CSW, a column decoder CDEC, a read amplifier RA, and a write amplifier WA. The memory cell array ARY has a plurality of dynamic memory cells MC, word lines WL each connected to the memory cells MC arranged in one direction, and bit lines BL, /BL each connected to the memory cells MC arranged in a direction perpendicular to the one direction. Each of the memory cells MC has a capacitor holding data as an electric charge and a transfer transistor in which one and the other of a source/a drain are connected to the bit line BL (or /BL) and the capacitor (storage node) respectively. The other end of the capacitor is connected to a precharge voltage line VPR. A gate of the transfer transistor is connected to the word line WL. Selecting the word line WL causes the execution of the read operation and the write operation.

The word decoder WDEC decodes the row address RAD to enable the selection of one of the word lines WL. The word driver WDRV activates the word lines WL in synchronization with the word line activation signal WLZ according to a decoded signal outputted from the word decoder WDEC. Each of the sense amplifier drivers SADRV activates sense amplifier activation signals PSA, NSA in synchronization with the sense amplifier activation signal LEZ.

The sense amplifiers SA operate in synchronization with the sense amplifier activation signals PSA, NSA to amplify a difference in signal amount of data read to the bit line pairs BL, /BL.

Each of the precharge circuits PRE supplies precharge voltage to the bit lines BL, /BL according to the precharge control signal PREZ. The column switches CSW are selectively turned on according to the column address CAD to connect the bit lines BL, /BL corresponding to the column address CAD to the read amplifier RA and the write amplifier WA. The column address decoder CDEC decodes the column address CAD to enable the selection of the bit line pair BL, /BL to/from which data DQ is to be inputted/outputted. At the time of a read access operation, the read amplifier RA amplifies complementary read data outputted via the column switch CSW. At the time of a write access operation, the write amplifier WA amplifies complementary write data supplied via the data bus DB to supply the resultant to the bit line pair BL, /BL.

Figure 2:
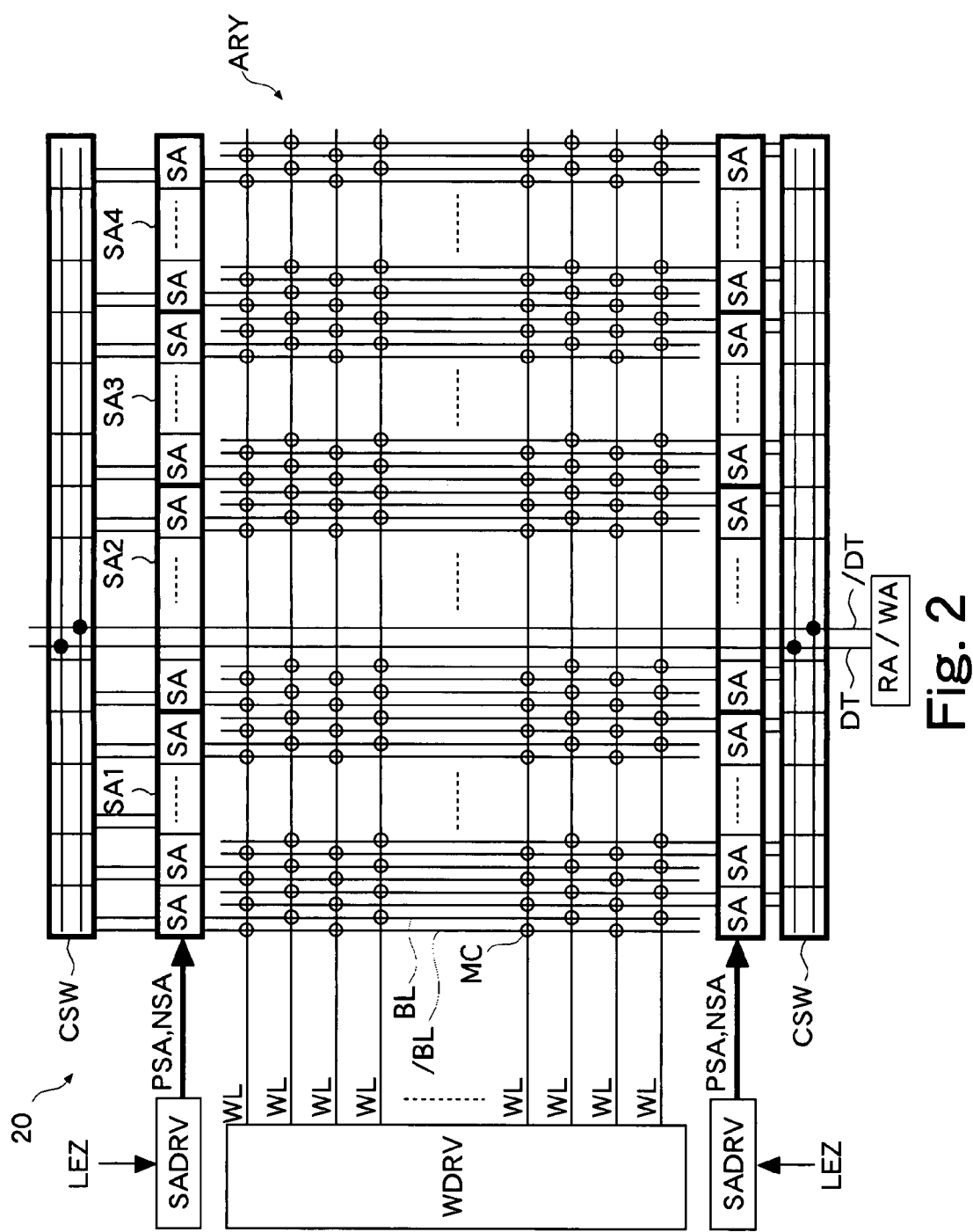
FIG. 2 is a block diagram showing details of a memory core shown in FIG. 1.

FIG. 2 shows details of the memory core 20 shown in FIG. 1. The memory cells MC connected to each of the word lines WL are connected to one of the complementary bit lines BL, /BL. The bit line pairs BL, /BL are connected to the sense amplifiers SA respectively. When the memory cell MC connected to one of the bit line pair BL, /BL is accessed, the other of the bit line pair BL, /BL functions as a reference bit line.

In this example, the word driver WDRV is disposed on the left of the memory cell array ARY. The sense amplifiers SA and the column switches CSW are both arranged on an upper side and a lower side of the memory cell array ARY. The sense amplifier drivers SADRV are arranged on an upper side and a lower side of the word driver WDRV. The sense amplifiers SA, the column switches CSW, and the sense amplifier driver SADRV arranged on the upper side and those arranged on the lower side of the memory cell array ARY have the same circuit configurations and thus form a symmetric structure. Therefore, only the circuits arranged on the upper side of the memory cell array ARY will be described. Incidentally, the arrangement of the word driver WDRV, the sense amplifier drivers SADRV, and so on is not limited to the positions in FIG. 2. For example, the sense amplifier drivers SADRV may be arranged on the right of the memory cell array ARY, or may be arranged on the upper side and the lower side of the memory cell array ARY.

The sense amplifiers SA are divided into, for example, four sense amplifier groups (areas) SA1-4 shown by the heavy-line frames. The sense amplifier groups SA1, SA2, SA3, SA4 are arranged in this order from the word driver WDRV side. Each of the bit line pairs BL, /BL is connected to the column switch CSW via each of the sense amplifiers SA and is further connected to common data lines DT, /DT via the column switch CSW. The data lines DT, /DT are arranged in correspondence to each bit of the data terminal DQ. For example, the column switches CSW in number equal to the number of the bits of the data terminal DQ or in number equal to an integral multiple of the number of the bits of the data terminal DQ turn on simultaneously according to the column address CAD, and data are inputted/outputted to/from the bit line pair BL, /BL corresponding to the data terminal DQ.

When the word line WL is activated in the read operation in response to the read command RD and in the write operation in response to the write command WR, the transfer transistors of the memory cells MC close to the word driver WDRV turn on earlier than the transfer transistors of the memory cells MC distant from the word driver WDRV. Therefore, as will be described later, during the normal operation mode, the operation start timing of the sense amplifiers SA is set based on the ON timing of the transfer transistor of the memory cell MC most distant from the word driver WDRV.

Figure 3:
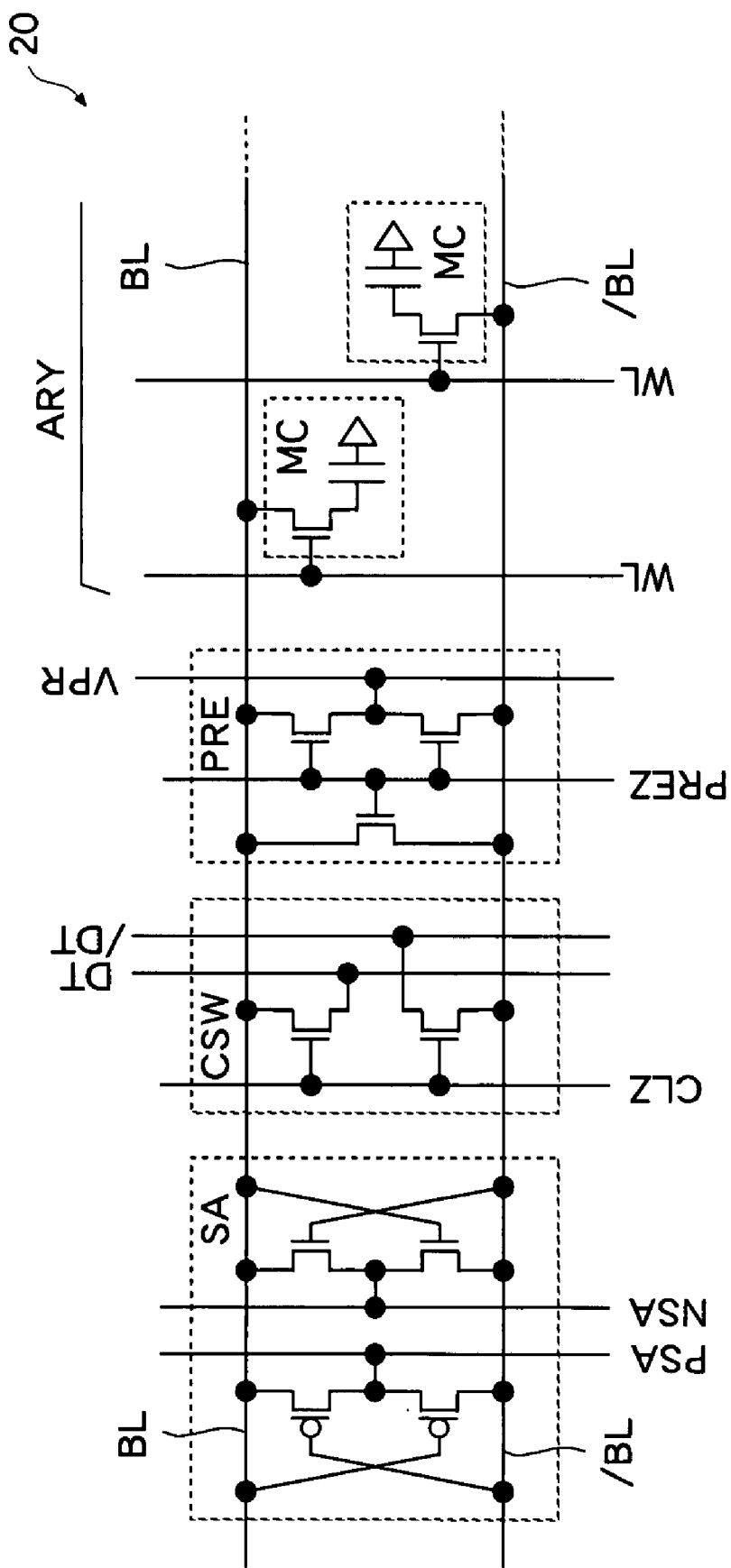
FIG. 3 is a circuit diagram showing an essential part of the memory core shown in FIG. 1.

FIG. 3 shows an essential part of the memory core 20 shown in FIG. 1. The sense amplifier SA is constituted of a pair of CMOS inverters whose inputs and outputs are connected to each other. An input of each of the CMOS inverters (gate of each transistor) is connected to the bit line BL (or /BL). Each of the CMOS inverters is constituted of an nMOS transistor and a pMOS transistor which are arranged in a lateral direction in the drawing. Sources of the pMOS transistors of the CMOS inverters receive the sense amplifier activation signal PSA. Sources of the nMOS transistors of the CMOS inverters receive the sense amplifier activation signal NSA. The sense amplifier activation signal PSA is set to high-level voltage when the sense amplifier SA is to be operated, and is set to precharge voltage VPR when the sense amplifier SA is not to be operated. The sense amplifier activation signal NSA is set to low-level voltage (for example, ground voltage) when the sense amplifier SA is to be operated, and is set to the precharge voltage VPR when the sense amplifier SA is not to be operated.

The column switch CSW is composed of an nMOS transistor connecting the bit line BL to the data line DT and an nMOS transistor connecting the bit line /BL to the data line /DT. Gates of the nMOS transistors receive a column selection signal CLZ. At the time of the read operation, read data signals on the bit lines BL, /BL amplified by the sense amplifier SA are transmitted to the data lines DT, /DT via the column switch CSW. At the time of the write operation, write data signals supplied via the data lines DT, /DT are written to the memory cells MC via the bit lines BL, /BL. The data lines DT, /DT are connected to the read amplifier RA and the write amplifier WA.

The precharge circuit PRE is composed of a pair of nMOS transistors for connecting the complementary bit lines BL, /BL to the precharge voltage line VPR respectively, and an nMOS transistor for connecting the bit lines BL, /BL to each other. Gates of the nMOS transistors of the precharge circuit PRE receive the precharge control signal PREZ. While receiving the precharge control signal PREZ with high logic level, the precharge circuit PRE supplies the precharge voltage VPR to the bit lines BL, /BL and equalizes voltages of the bit lines BL, /BL.

Figure 4:
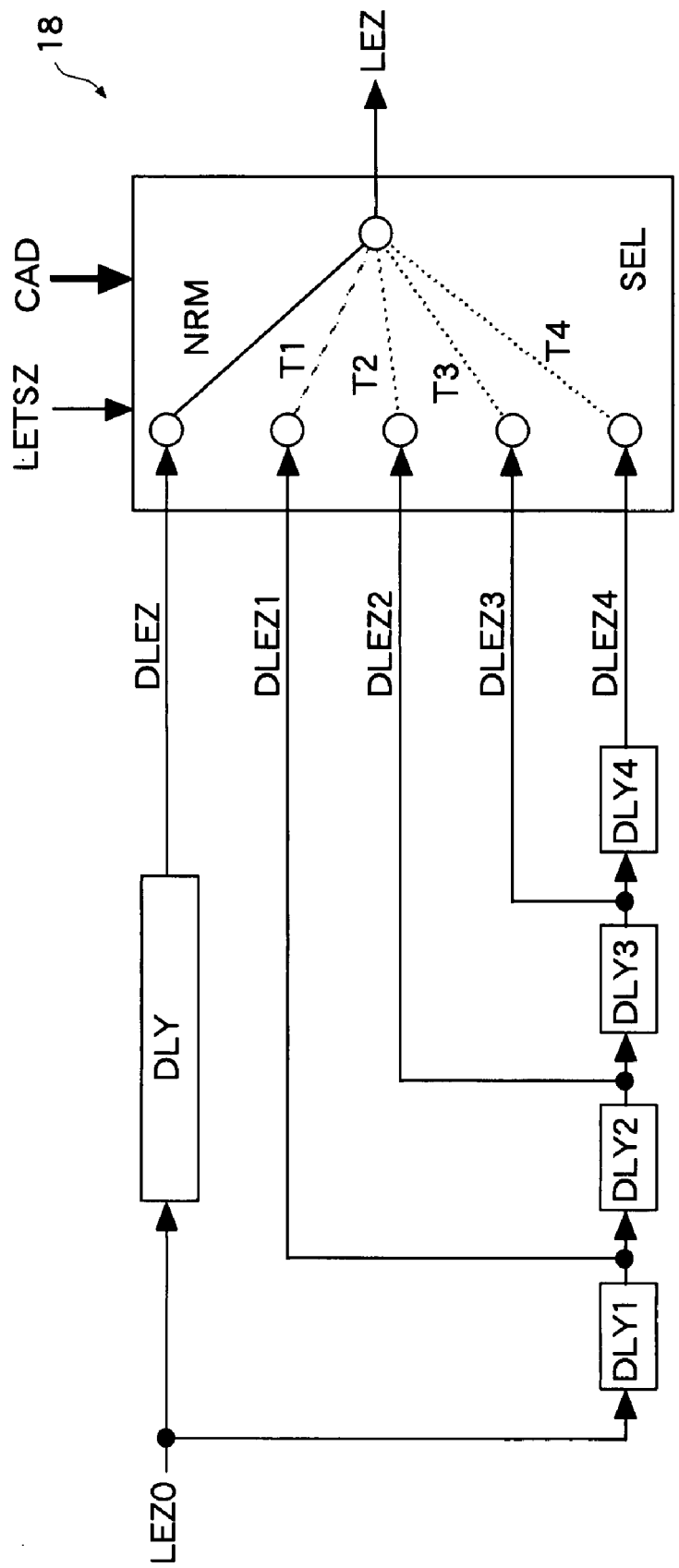
FIG. 4 is a block diagram showing an essential part of a core control circuit shown in FIG. 1.

FIG. 4 shows an essential part of the core control circuit 18 shown in FIG. 1. The core control circuit 18 has delay circuits DLY, DLY1, DLY2, DLY3, DLY4 and a selector SEL. The delay circuit DLY delays a rising edge of a basic sense amplifier activation signal LEZ0 which is generated in the core control circuit 18 in response to an access command and outputs the resultant as a delay signal DLEZ. The delay circuits DLY1-4 are connected in series. The delay circuit DL1 delays the rising edge of the basic sense amplifier activation signal LEZ0 to output the resultant as a delay signal DLEZ1. The delay circuits DLY2-4 delay rising edges of delay signals DLEZ1-3 received from a preceding stage and outputs the resultants as the delay signals DLEZ2-4. Incidentally, the timing of falling edges of the delay signals DLEZ, DLEZ1-4 are the same as the timing of a falling edge of, for example, the basic sense amplifier activation signal LEZ0.

For example, a delay time of the delay circuit DLY is set longer than the sum of delay times of the delay circuits DLY1-4. The delay times of the delay circuits DLY1-4 are, for example, equal to one another. Incidentally, in a case where the sense amplifiers SA are different in distance from the sense amplifier driver SADRV, that is, in a case where propagation delay times of the sense amplifier activation signals PSA, NSA to the sense amplifiers SA are different, the difference in the propagation delay time is taken into consideration in deciding the delay times of the delay circuits DLY1-4.

The selector SEL functions as a switch for selecting one of the delay signals DLEZ, DLEZ1-4 to output the selected signal as the sense amplifier activation signal LEZ. When the test signal LETSZ is inactive (low logic level), the selector SEL outputs the delay signal DELZ as the sense amplifier activation signal LEZ (normal operation mode NRM). When the test signal LETSZ is active (high logic level), the selector SEL outputs one of the DLEZ1-4 as the sense amplifier activation signal LEZ according to the column address CAD. Concretely, during the test mode, the selector SEL selects the delay signal DLEZ1 when the column address CAD indicates the sense amplifier area SA1 shown in FIG. 2. During the test mode, the selector SEL selects the delay signals DLEZ2-4 when the column address CAD indicates the sense amplifier areas SA2-4, respectively.

Figure 5:
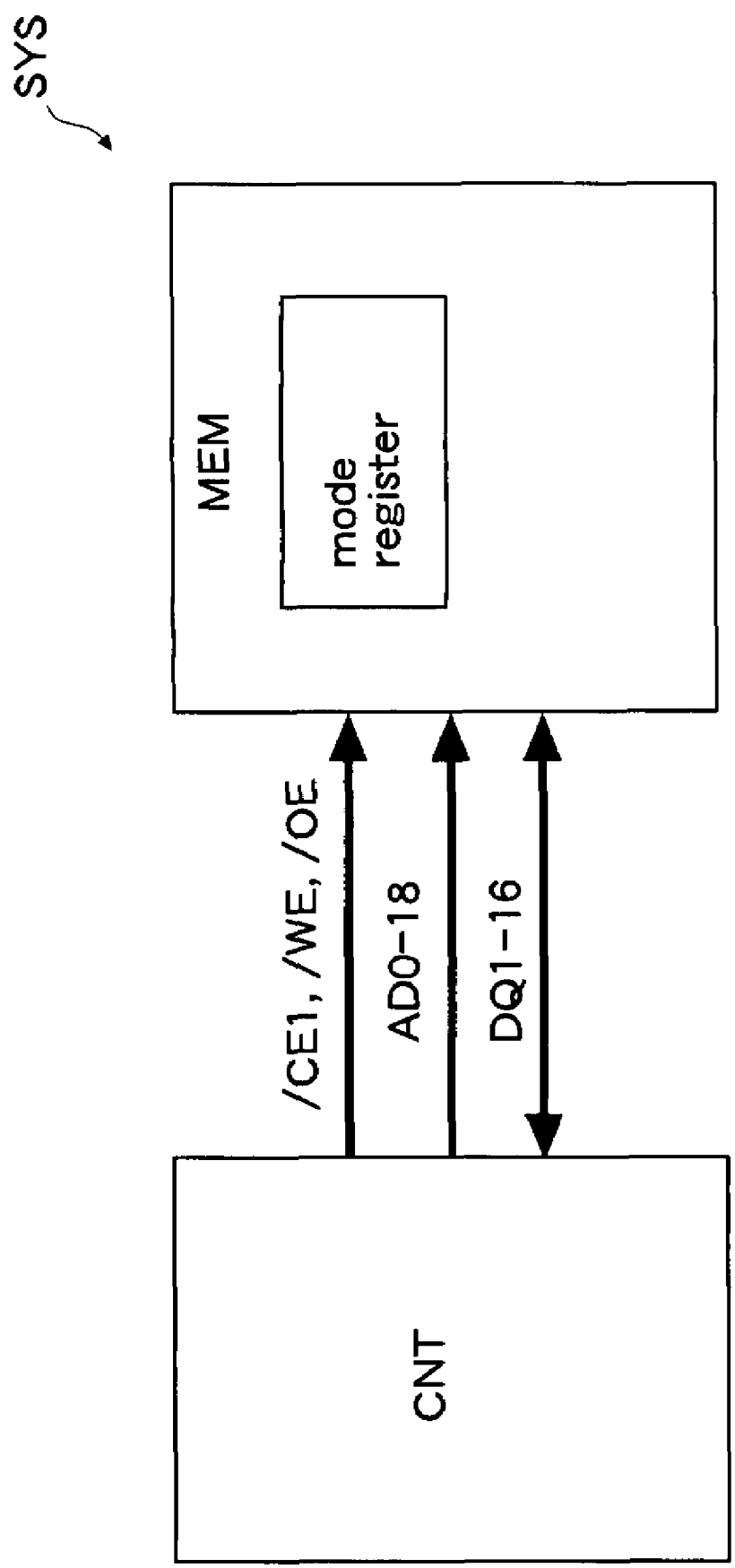
FIG. 5 is a block diagram showing a system for testing the memory shown in FIG. 1.

FIG. 5 shows a system SYS for testing the memory MEM shown in FIG. 1. The system SYS is also used for testing memories MEM of second, third, and fourth embodiments which will be described later. The system SYS has, for example, a memory chip MEM and a controller CNT accessing the memory chip MEM and is formed as a System in Package SiP. The controller CNT in a state of being assembled in the SiP has a function of testing the memory MEM. Incidentally, in a case where the system SYS is formed as, for example, a LSI test system, the controller CNT is installed in a LSI tester. The memory MEM in a wafer state, a chip state, or a packaged state is connected to the LSI tester.

To access the memory MEM, the controller CNT outputs an access command (/CE1, /WE, /OE), an address AD, and write data DQ and receives read data DQ from the memory MEM. Further, to set the mode register 12, the controller CNT outputs the access command (/CE1, /WE, /OE) and the address AD. According to the setting of the mode register 12, an operation state of the memory MEM is set to the normal operation mode or the test mode.

Figure 6:
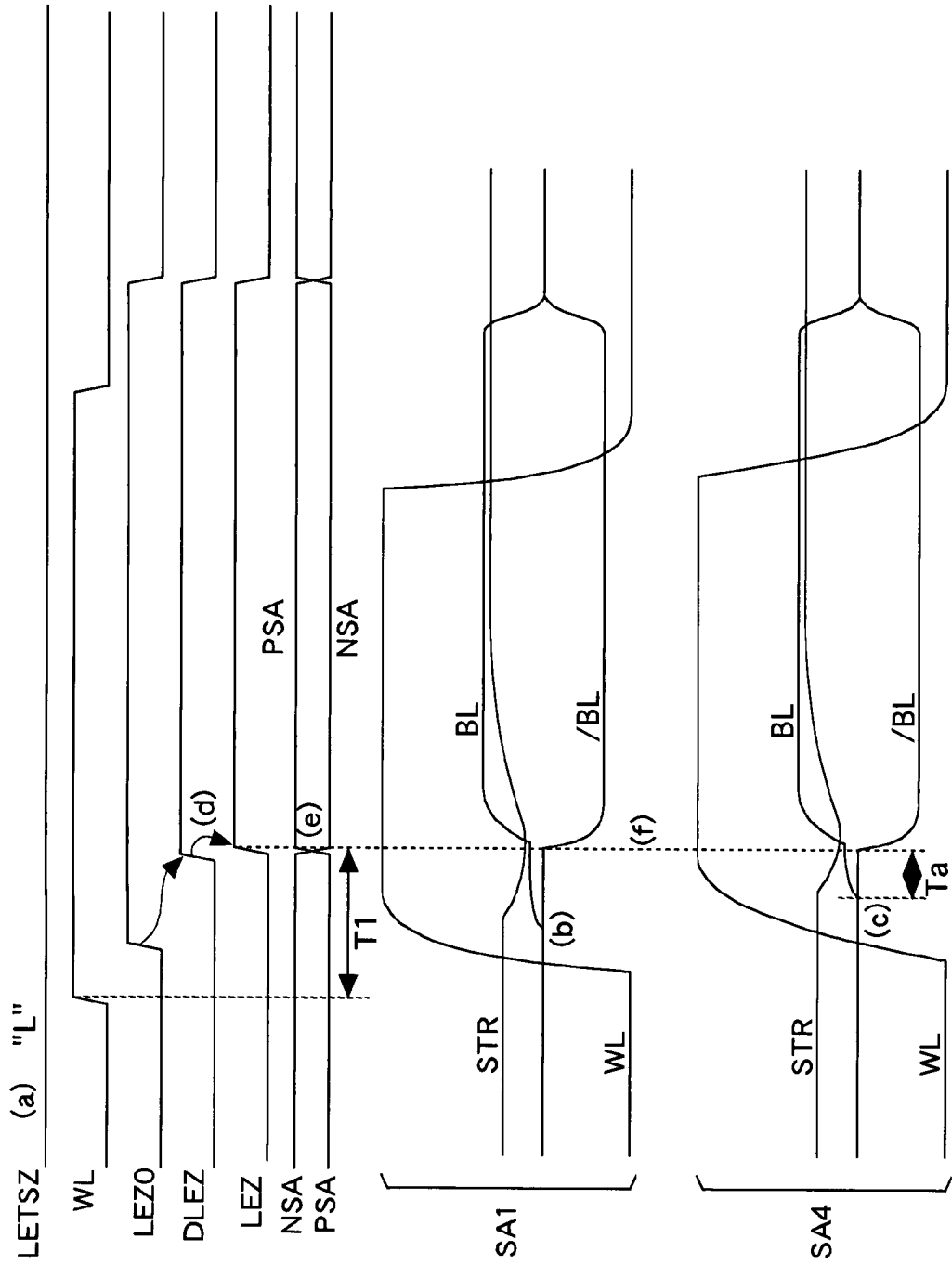
FIG. 6 is a timing chart showing a read operation of the memory during a normal operation mode.

FIG. 6 shows a read operation of the memory MEM during the normal operation mode. The read operation is executed when the read command RD (/CE1=L, /WE=H, /OE=L) is supplied. During the normal operation mode, the test signal LETSZ is kept at low logic level L (FIG. 6 (a)). When the word line WL is activated, the transfer transistors of the memory cells MC connected to the word line WL turn on in sequence from a word driver WDRV side. Therefore, to the bit lines BL (or /BL) corresponding to the sense amplifier area SA1 close to the word driver WDRV, data are read from the memory cells MC at relatively early timing (FIG. 6 (b)). On the other hand, to the bit lines BL (or /BL) corresponding to the sense amplifier area SA4 distant from the word driver WDRV, data are read from the memory cells MC at relatively late timing (FIG. 6 (c)). Waveforms of the word line WL shown in the sense amplifier areas SA1, SA4 in the drawing represent voltages of the gates of the transfer transistors. The reference symbol STR represents voltage of the storage node of each of the memory cells MC.

The core control circuit 18 shown in FIG. 4 outputs, as the sense amplifier activation signal LEZ, the delay signal DLEZ generated by delaying the basic sense amplifier activation signal LEZ0 (FIG. 6 (d)). The sense amplifier driver SADRV activates the sense amplifier activation signals PSA, NSA in synchronization with the sense amplifier activation signal LEZ (FIG. 6 (e)). The sense amplifiers SA in all the sense amplifier areas SA1-4 start an amplifying operation in synchronization with the activation of the sense amplifier activation signals PSA, NSA (FIG. 6 (f)).

In the normal operation mode, a time interval T1 after the word driver WDRV activates the word line W until the sense amplifiers SA start the amplifying operation is set long enough to allow the data in the memory cells MC corresponding to the sense amplifier area SA4 to be read to the bit lines BL (or /BL). Concretely, a time interval Ta after the transfer transistor of the memory cell MC arranged farthest from the word driver WDRV turns on until the sense amplifier activation signal LEZ (PSA, NSA) is activated is set long enough to allow its data to be read to the bit line BL (or /BL). By setting the activation timing of the sense amplifier activation signals PSA, NSA according the ON timing of the transfer transistor of the memory cell MC having the shortest time interval up to the operation start of the sense amplifiers SA, it is possible to surely read data from all the memory cells MC.

A write operation is executed when the write command WR (/CE1=L, /WE=L, /OE=H) is supplied. When the write operation is executed, the sense amplifiers SA amplify a signal amount of the write data DQ supplied via the data terminal DQ. The other operation is the same as that of the read operation except in that the activation timing of the column selection signal CLZ is earlier than in the read operation.

Figure 7:
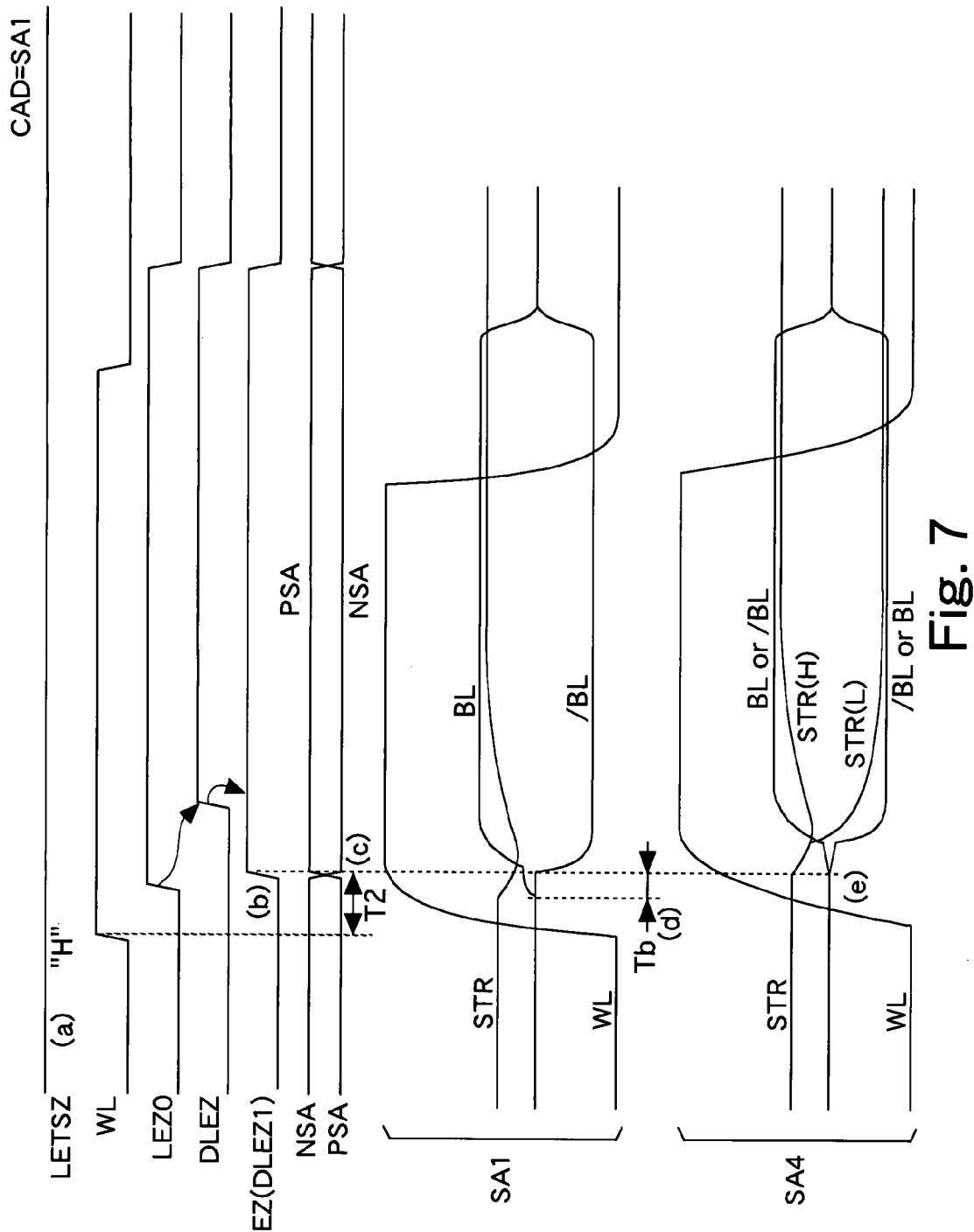
FIG. 7 is a timing chart showing a read operation of the memory during a test mode.

FIG. 7 shows a read operation of the memory MEM during the test mode. In this example, the column address CAD corresponding to the sense amplifier area SA1 is supplied. Detailed description of the same operations as those described in FIG. 6 will be omitted. During the test mode, the test signal LETSZ is kept at high logic level H (FIG. 7 (a)).

The core control circuit 18 shown in FIG. 4 outputs, as the sense amplifier activation signal LEZ, the delay signal DLEZ1 which is generated by delaying the basic sense amplifier activation signal LEZ0 (FIG. 7 (b)). The sense amplifiers SA in all the sense amplifier areas SA1-4 start the amplifying operation a time interval T2 later after the word line WL is activated (FIG. 7 (c)). The time interval T2 is set so that the sense amplifiers SA start their operation immediately after data are read to the bit line BL (or /BL) from the memory cells MC corresponding to the sense amplifier area SA1. Concretely, a time interval Tb after the transfer transistors of the memory cells MC corresponding to the sense amplifier area SA1 closest to the word driver WDRV turn on until the sense amplifiers SA starts their operation is set to a time interval during which data with the minimum signal amount is read to the bit lines BL (or /BL) (FIG. 7 (d)). Therefore, the read operation from the memory cells MC corresponding to the sense amplifier area SA1 is executed at strict timing. Consequently, it is possible to correctly evaluate the operation margins of the memory cells M corresponding to the sense amplifier area SA1.

On the other hand, as for the memory cells MC corresponding to the sense amplifier areas SA2-4, before data therein are read to the bit lines BL, /BL, the sense amplifiers SA are activated since the sense amplifier activation signals PSA, NSA are activated relatively early. Therefore, erroneous data are read (FIG. 7 (e)). "H" and "L" of the storage nodes STR of the memory cells MC indicate that high logic level and low logic level are written in the memory cells MC respectively. Which logic is stored in the memory cells MC depends an electric characteristic and the like of each of the memory cells M. However, in the test mode, this has no significance since it is only necessary that the operation margin of the test target memory cell MC can be evaluated. Incidentally, inactivation timing of the sense amplifier activation signal LEZ is the same as in the normal operation mode.

Figure 8:
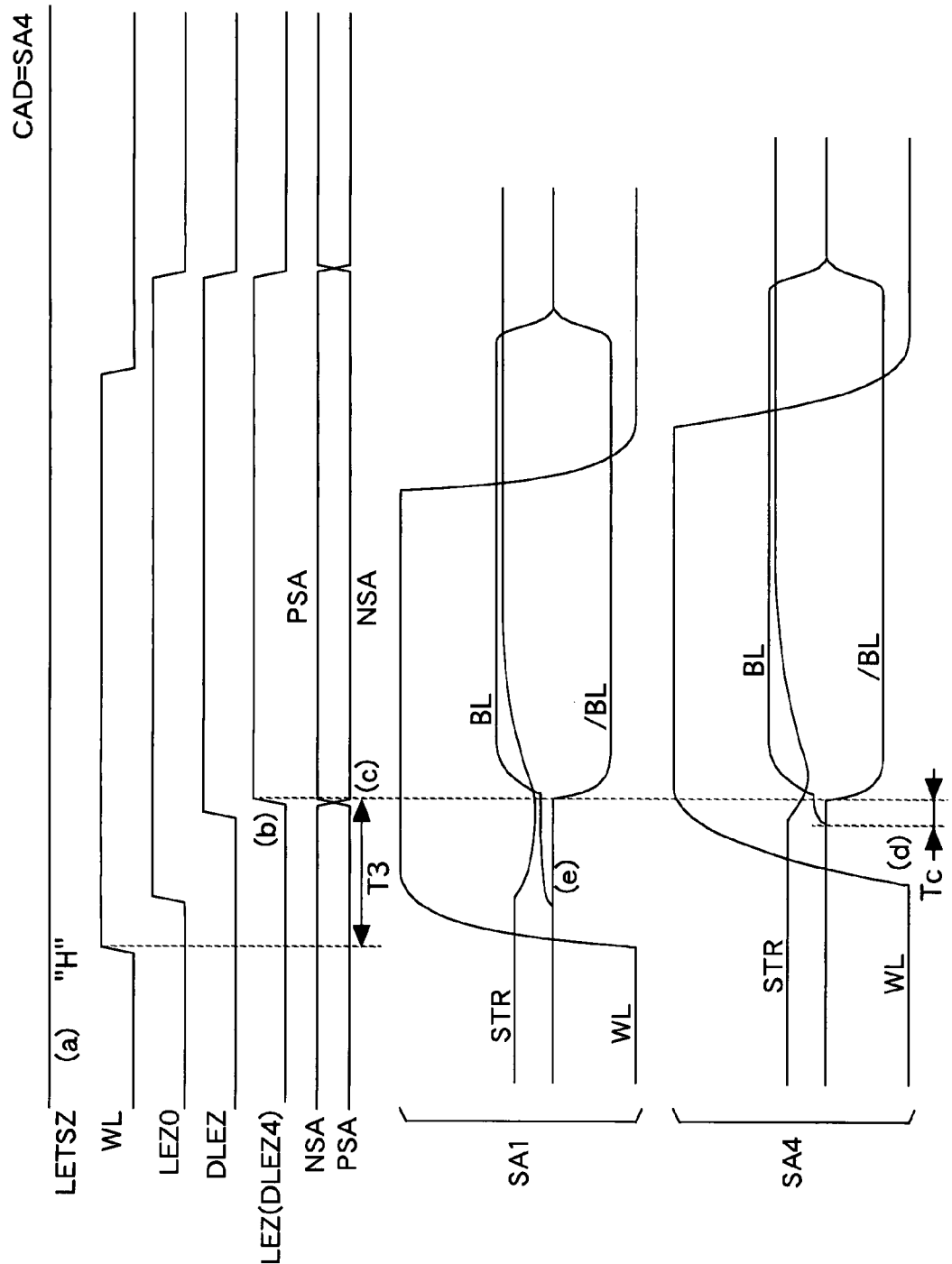
FIG. 8 is a timing chart showing a read operation of the memory during the test mode.

FIG. 8 shows a read operation of the memory MEM during the test mode. In this example, the column address CAD corresponding to the sense amplifier area SA4 is supplied. Detailed description of the same operations as those in FIG. 6 and FIG. 7 described above will be omitted. Since the set mode is the test mode, the test signal LETSZ is kept at high logic level H (FIG. 8 (a)).

The core control circuit 18 outputs, as the sense amplifier activation signal LEZ, the delay signal DLEZ4 which is generated by delaying the basic sense amplifier activation signal LEZ0 (FIG. 8 (b)). The sense amplifiers SA in all the sense amplifier areas SA1-4 start the amplifying operation a time interval T3 later after the word line WL is activated (FIG. 8 (c)). The time interval T3 is set so that the sense amplifiers SA start their operation immediately after data are read to the bit lines BL (or /BL) from the memory cells MC corresponding to the sense amplifier area SA4. Concretely, a time interval Tc after the transfer transistors of the memory cells MC corresponding to the sense amplifier area SA4 farthest from the word driver WDRY turn on until the sense amplifiers SA start their operation is set to a time interval during which data with the minimum signal amount are read to the bit line BL (or/BL)

(FIG. 8 (d)). The time interval Tc is equal to the time interval Tb in FIG. 7. Therefore, the read operation from the memory cells MC corresponding to the sense amplifier area SA4 is executed at the same strict timing as that when the memory cells MC corresponding to the sense amplifier area SA1 shown in FIG. 7 are evaluated. Consequently, it is possible to correctly evaluate the operation margins of the memory cells MC corresponding to the sense amplifier area SA4.

On the other hand, as for the memory cells MC corresponding to the sense amplifier areas SA1-3, after data therein are sufficiently read to the bit lines BL, /BL, the sense amplifiers SA are activated since the sense amplifier activation signals PSA, NSA are activated relatively late. Therefore, the data are surely read (FIG. 8 (e)). However, in the test mode, this has no significance since it is only necessary that the operation margin of the test target memory cell can be evaluated. Incidentally, the inactivation timing of the sense amplifier activation signal LEZ is the same as in the normal operation mode.

As described above, in the present invention, during the test mode, the core control circuit 18 changes, according to the column address CAD, the time interval after the word line WL is activated by the word driver WDRV until the sense amplifier activation signals PSA, NSA are activated. Specifically, during the test mode, the core control circuit 18 activates the sense amplifier activation signal LEZ in synchronization with the timing at which the data is read to the bit line BL (/BL) from the memory cell MC selected by the column address CAD. Therefore, the time interval after the transfer transistor turns on and the data is read to the bit line BL (/BL) from the test target memory cell MC until the corresponding sense amplifier SA starts the amplifying operation (the time interval up to the activation of the sense amplifier activation signal LEZ) can be made constant irrespective of the position of the memory cell. That is, the same test condition can be set for the memory cells MC irrespective of the positions of the memory cells MC. As a result, the operation margins of the memory cells MC can be correctly evaluated irrespective of the positions of the memory cells MC.

Figure 9:
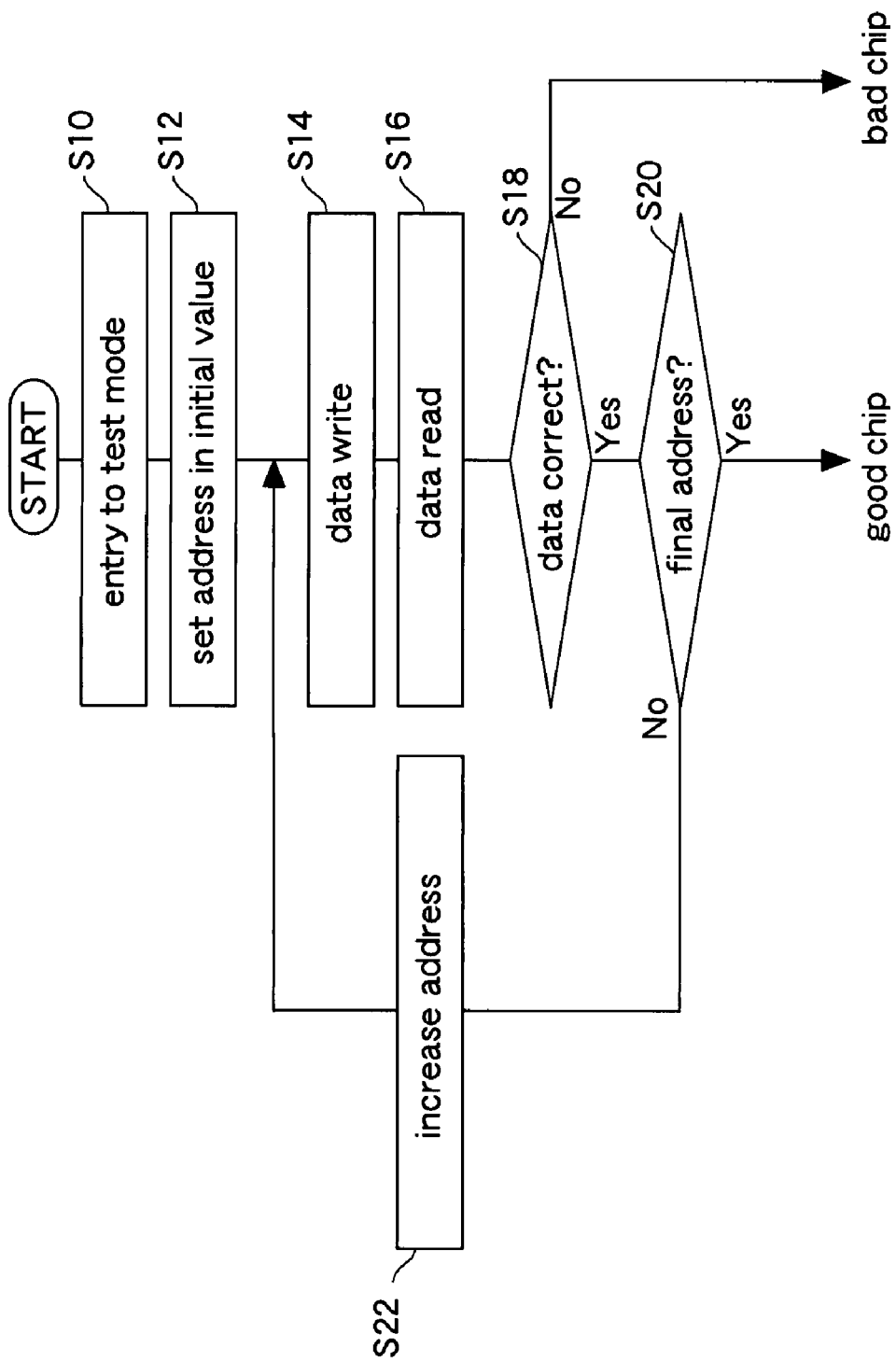
FIG. 9 is a flowchart showing an example of a testing method of the memory.

FIG. 9 shows an example of a testing method of the memory MEM. This test flow is executed by, for example, the controller CNT shown in FIG. 5. The form of the memory MEM may be any of the wafer state, the chip state, and the packaged state.

First, at Step S10, the controller CNT accesses the mode register 12 and shifts the operation mode of the memory MEM from the normal operation mode to the test mode. At Step S12, the controller CNT sets an address AD indicating a test target memory cell MC to an initial value.

Next, at Step S14, test data is written to the memory cell MC, and at Step S16, the written test data is read from the memory cell MC. Here, as shown in FIG. 7 and FIG. 8, in the read operation of the test data, the core control circuit 18 changes the activation timing of the sense amplifier activation signal LEZ according to the column address CAD. Therefore, the test target memory cell MC is read-accessed under a strict test condition.

Next, at Step S18, it is confirmed whether or not the read data is correct. At an instant when the data is found erroneous, the test of the memory MEM is cancelled, and the memory MEM is handled as a bad chip. If the data is correct, it is confirmed at Step S20 whether or not the test has been conducted for up to the final address. That is, it is confirmed whether or not all the memory cells MC have been tested. If all the memory cells MC have been tested, the test is finished and the memory MEM is handled as a good chip. If there still remains a memory cell MC to be tested, the address is incremented at Step S22, and the test is conducted again by using a different address.

In the foregoing first embodiment, the strict test condition can be constantly set for the memory cells MC irrespective of the positions of the memory cells MC. Concretely, during the test mode, the time interval after the transfer transistors turn on until the sense amplifier activation signal LEZ is activated is always set constant. Therefore, it is possible to correctly evaluate the operation margins of the memory cells MC irrespective of the positions of the memory cells MC. Since memories MEM possibly becoming bad chips in the market can be surely excluded as bad chips in the test process, reliability of the memory MEM can be improved.

During the test mode, since the activation timing of the sense amplifier activation signal LEZ is changed according to the column address CAD, the sense amplifier control circuit (core control circuit 18) can be configured with a simple circuit. Since the operation mode can be shifted to the test mode only by accessing the mode register 2, there is no need to form an external terminal such as a test mode terminal. An external terminal (pad) is larger in layout area than elements such as transistors. Moreover, the area of the pad tends to become relatively larger with the progress of the semiconductor technology. Therefore, it is possible to prevent an increase in chip size of the memory MEM ascribable to a test pad.

Figure 10:
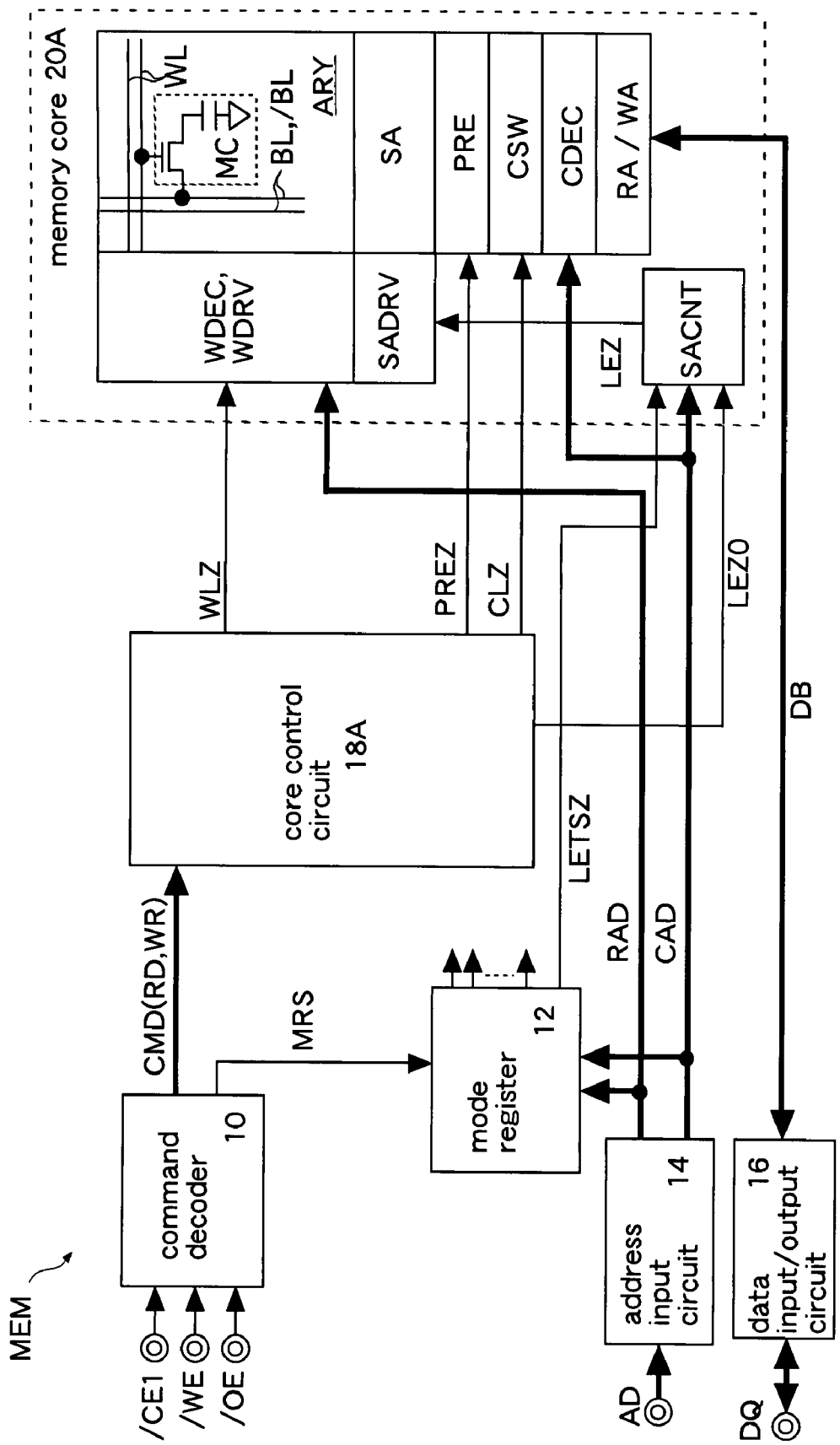
FIG. 10 is a block diagram showing a second embodiment of the present invention.

FIG. 10 shows a second embodiment of the present invention. The same reference numerals and symbols are used to designate the same elements as the elements described in the first embodiment, and detailed description thereof will be omitted. In this embodiment, a core control circuit 18A and a memory core 20A are formed in place of the core control circuit 18 and the memory core 20 of the first embodiment. The other configuration is the same as that of the first embodiment.

The core control circuit 18A has the same circuitry as that of the core control circuit 18 of the first embodiment with the circuit shown in FIG. 4 being removed. The core control circuit 18A does not receive the column address CAD. Further, the core control circuit 18A outputs the basic sense amplifier activation signal LEZ0 instead of the sense amplifier activation signal LEZ to the memory core 20A. The memory core 20A has the same circuitry as that of the memory core 20 of the first embodiment with a sense amplifier control circuit SACNT being additionally provided. The other configurations of the core control circuit 18A and the memory core 20A are the same as those of the core control circuit 18 and the memory core 20 of the first embodiment.

The circuit configuration of the sense amplifier control circuit SACNT is the same as that of the circuit shown in FIG. 4. That is, in this embodiment, in the memory core 20A, activation timing of the sense amplifier activation signal LEZ is changed according to whether a current operation mode is the normal operation mode or the test mode. During the test mode, the activation timing of the sense amplifier activation signal LEZ is changed according to the column address CAD. The operations in the normal operation mode and the test mode are the same as those in FIG. 6, FIG. 7, and FIG. 8 described above.

The sense amplifier control circuit SACNT is arranged, for example, on an upper side or on a lower side of the word driver WDRV shown in FIG. 2. The sense amplifier control circuit SACNT is arranged in one of four corners of the memory cell array ARY. The four corners of the memory cell array ARY often have space where no circuit is disposed. The effective use of space to form the sense amplifier control circuit SACNT makes it possible to prevent an increase in chip size of the memory MEM. The foregoing second embodiment can also provide the same effect as that of the first embodiment previously described.

Figure 11:
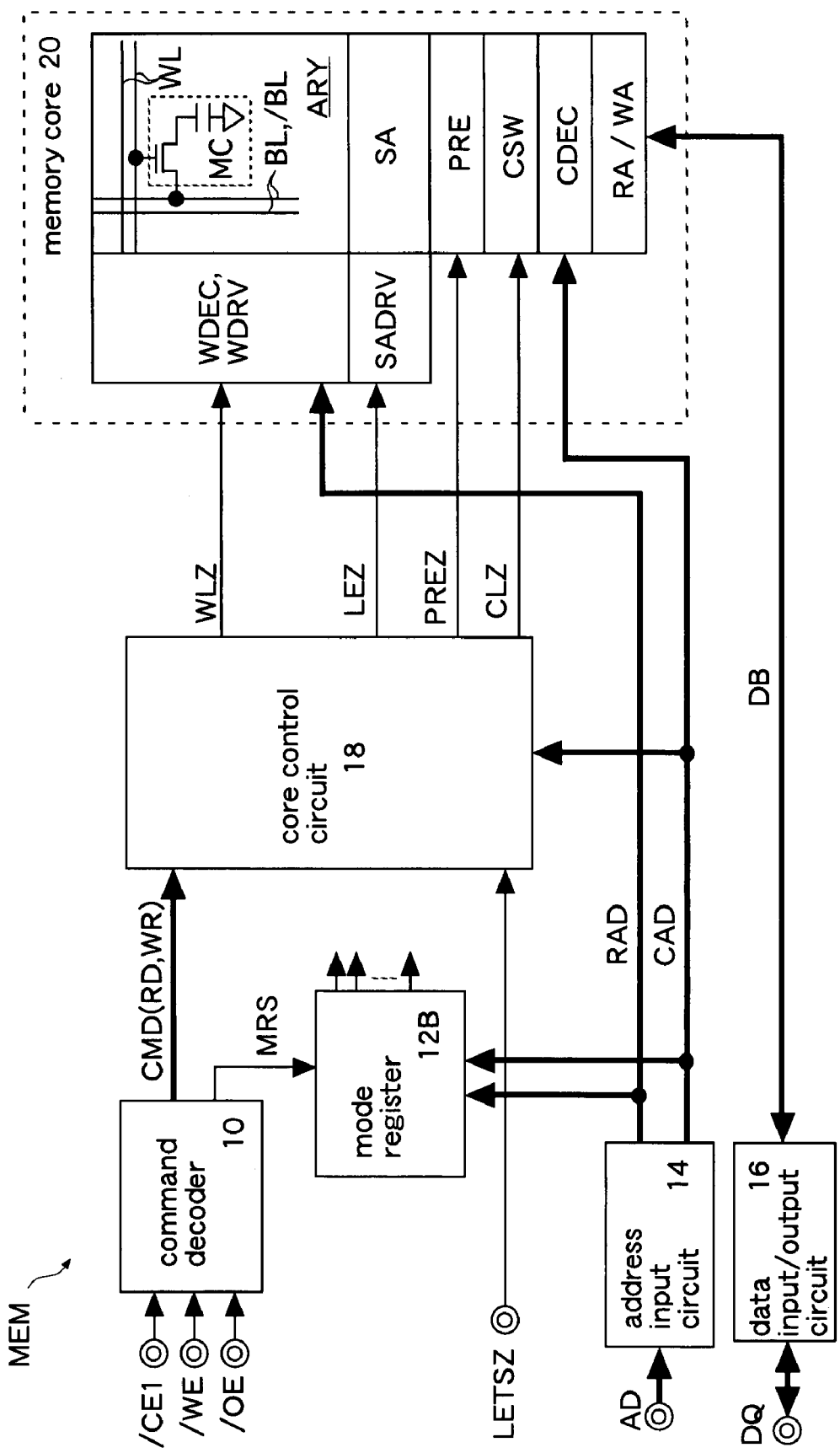
FIG. 11 is a block diagram showing a third embodiment of the present invention.

FIG. 11 shows a third embodiment of the present invention. The same reference numerals and symbols are used to designate the same elements as the elements described in the first embodiment, and detailed description thereof will be omitted. In this embodiment, a mode register 12B is formed in place of the mode register 12 of the first embodiment. Further, a memory MEM has a test terminal receiving a test signal LETSZ. The other configuration is the same as that of the first embodiment.

The structure of the mode register 12B is the same as that of the mode register 12 of the first embodiment except in that the mode register 12B does not have a function of outputting the test signal LETSZ according to a set value. According to the test signal LETSZ supplied via the test terminal, the core control circuit 18 operates in the normal operation mode or in the test mode and changes activation timing of the sense amplifier activation signal LEZ. The operations in the normal operation mode and in the test mode are the same as those in FIG. 6, FIG. 7, and FIG. 8 described above. When the memory MEM is shipped, the test terminal LETSZ is connected to, for example, a ground line. Therefore, the memory MEM does not operate in the test mode under a user's usage environment.

The foregoing third embodiment can also provide the same effect as that of the first embodiment previously described. Moreover, in this embodiment, since the test signal LETSZ can be directly supplied from an external part of the memory MEM, the test mode can be easily shifted from the normal operation mode by the controller CNT or the like.

Figure 12:
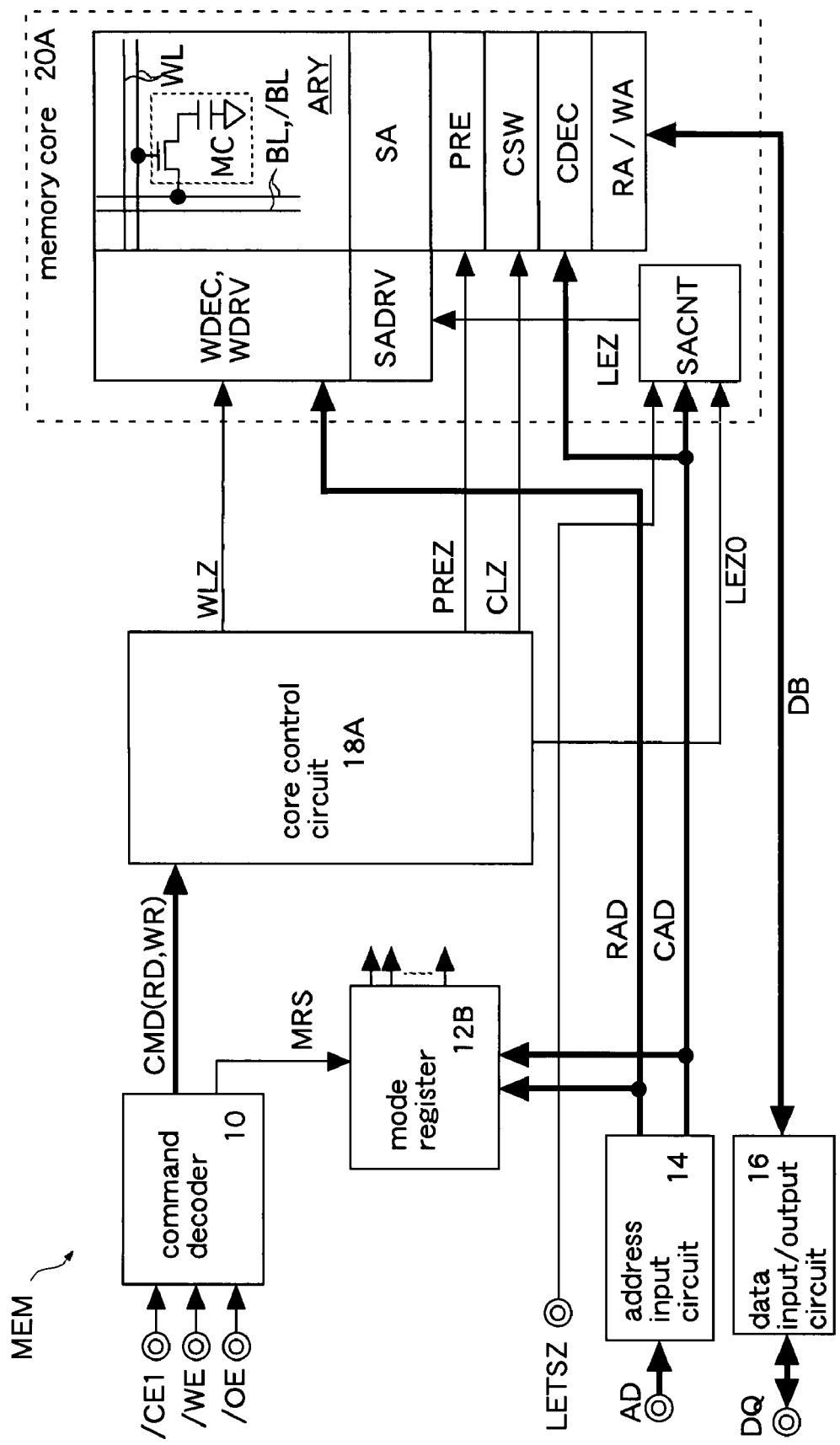
FIG. 12 is a block diagram showing a fourth embodiment of the present invention.

FIG. 12 shows a fourth embodiment of the present invention. The same reference numerals and symbols are used to designate the same elements as the elements described in the first and third embodiments, and detailed description there of will be omitted. In this embodiment, a memory MEM has the core control circuit 18A and the memory core 20A of the second embodiment, and the mode register 12B and the test terminal LETSZ of the third embodiment. The other configuration is the same as that of the first embodiment.

In this embodiment, according to a test signal LETSZ supplied via the test terminal, the sense amplifier control circuit SACNT formed in the memory core 20A operates in the normal operation mode or the test mode and changes the activation timing of the sense amplifier activation signal LEZ. The foregoing fourth embodiment can also provide the same effects as those of the first, second, and third embodiments previously described.

The above embodiments have described the examples where the present invention is applied to the pseudo SRAM (FCRAM). It should be noted that the present invention is not limited to these embodiments. For example, the present invention may be applied to a DRAM and a SDRAM. Alternatively, the present invention may be applied to a SRAM and a nonvolatile semiconductor memory.

The above embodiments have described the examples where the present invention is applied to the memory MEM in the wafer sate, chip state, or packaged state or to the system SYS having the memory MEM therein. The present invention is not limited to such embodiments. For example, the present invention may be applied to a system LSI in which a macro of the memory MEM is installed, a CPU having the memory MEM therein, and the like.

The above embodiments have described the examples where, during the test mode, the activation timing of the sense amplifier activation signal LEZ is changed depending on which one of the four sense amplifier areas SA1-4 the column address CAD indicates. The present invention is not limited to such embodiments. For example, by grouping the sense amplifiers SA into a larger number of sense amplifier areas, the activation timing of the sense amplifier activation signal LEZ may be changed depending on which one of the sense amplifier areas the column address CAD indicates.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor memory comprising:
   a plurality of memory cells;
   a word line connected to said memory cells;
   a plurality of bit lines connected to said memory cells respectively;
   a word driver connected to one end of said word line to drive said word line;
   a plurality of sense amplifiers connected to said bit lines respectively;
   a plurality of column switches disposed for said sense amplifiers respectively and selectively turned on according to a column address to connect said sense amplifiers to a common data line; and
   a sense amplifier control circuit which activates a sense amplifier activation signal to cause said sense amplifiers to operate, and during a test mode, changes a time interval from activation of the word line up to the activation of said sense amplifier, according to said column address in order to make constant a time interval after data is read from the test target memory cell to the bit line until the corresponding sense amplifier starts an amplifying operation, irrespective of a position of the memory cell.

2. The semiconductor memory according to claim 1, wherein
   during a normal operation mode, said sense amplifier control circuit activates said sense amplifier activation signal after the data is read to the bit line from the memory cell arranged at a position farthest from said word driver, and
   during said test mode, said sense amplifier control circuit activates said sense amplifier activation signal in synchronization with timing at which the data is read to the bit line from the memory cell selected according to said column address.

3. The semiconductor memory according to claim 2, wherein:
   each of said memory cells includes a transfer transistor in which a gate is connected to said word line and one and the other of a source/a drain are connected to said bit line and a storage node respectively; and
   during said test mode, said sense amplifier control circuit makes constant a time interval after the transfer transistor of the memory cell selected according to said column address in response to the activation of said word line is turned on until said sense amplifier activation signal is activated.

4. The semiconductor memory according to claim 1, further comprising a mode setting unit whose value is rewritable from an exterior of the semiconductor memory and which changes an operation mode between a normal operation mode and said test mode according to the held value, wherein said sense amplifier control circuit changes activation timing of said sense amplifier activation signal according to the value held in the mode setting unit.

5. The semiconductor memory according to claim 1, further comprising a test terminal receiving a test signal, wherein said sense amplifier control circuit changes activation timing of said sense amplifier activation signal according to a value of said test signal.

6. A testing method of a semiconductor memory which comprises:

a plurality of memory cells;

a word line connected to said memory cells;

a plurality of bit lines connected to said memory cells respectively;

a word driver connected to one end of said word line to drive said word line;

a plurality of sense amplifiers connected to said bit lines respectively;

a plurality of column switches disposed for said sense amplifiers respectively and selectively turned on according to a column address to connect said sense amplifiers to a common data line; and a sense amplifier control circuit which activates a sense amplifier activation signal to cause said sense amplifiers to operate, and during a test mode, changes a time interval from activation of the word line up to the activation of said sense amplifier, according to said column address in order to make constant a time interval after data is read from the test target memory cell to the bit line until the corresponding sense amplifier starts an amplifying operation, the method comprising, during said test mode:

activating said word line to write data to the test target memory cell via the bit line;

activating said word line to read the data from the test target memory cell to the bit line;

activating said sense amplifier activation signal by said sense amplifier control circuit to amplify a signal amount of the data on the bit line; and detecting a failure of said semiconductor memory when a logic value of the data whose signal amount is amplified is different from an expected value.

* * * * *